United States Patent
Joung et al.

(10) Patent No.: US 10,062,964 B2
(45) Date of Patent: Aug. 28, 2018

(54) SHIELD BOX FOR WIRELESS TERMINAL TEST

(71) Applicant: INNOWIRELESS CO., LTD., Seongnam-si, Gyeonggi-do (KR)

(72) Inventors: Jin Soup Joung, Seongnam-si (KR); Yong Hoon Lim, Seoul (KR); GiHo Yun, Anyang-si (KR)

(73) Assignee: INNOWIRELESS CO., LTD., Seongnam-si (KR)

( * ) Notice: Subject to any disclaimer, the term of this patent is extended or adjusted under 35 U.S.C. 154(b) by 55 days.

(21) Appl. No.: 15/373,442

(22) Filed: Dec. 8, 2016

(65) Prior Publication Data

US 2018/0166777 A1 Jun. 14, 2018

(51) Int. Cl.
| | |
|---|---|
| *H04Q 1/42* | (2006.01) |
| *H01Q 1/22* | (2006.01) |
| *H01Q 9/04* | (2006.01) |
| *H04B 17/16* | (2015.01) |
| *H01Q 1/42* | (2006.01) |

(52) U.S. Cl.
CPC ............ *H01Q 1/42* (2013.01); *H01Q 1/2291* (2013.01); *H01Q 9/0407* (2013.01); *H04B 17/16* (2015.01)

(58) Field of Classification Search
CPC ...... H01Q 1/42; H01Q 1/2291; H01Q 9/0407; H04B 17/16
See application file for complete search history.

(56) References Cited

U.S. PATENT DOCUMENTS

| | | | | |
|---|---|---|---|---|
| 6,230,105 B1* | 5/2001 | Harris | ............... | G01R 29/0842 324/72 |
| 6,657,214 B1* | 12/2003 | Foegelle | ............ | G01R 29/0821 250/496.1 |
| 7,065,655 B1* | 6/2006 | Jakobsson | ............. | G06F 21/606 324/156 |
| 7,358,733 B2* | 4/2008 | Clark | ................... | G01V 5/0008 324/318 |
| 7,512,430 B2* | 3/2009 | Nakamura | ......... | G01R 29/0821 343/702 |

(Continued)

FOREIGN PATENT DOCUMENTS

| | | |
|---|---|---|
| JP | 10-019951 A | 1/1998 |
| JP | 2003-167013 A | 6/2003 |

(Continued)

*Primary Examiner* — Lewis West
(74) *Attorney, Agent, or Firm* — Novick, Kim & Lee, PLLC; Jae Youn Kim

(57) ABSTRACT

A shield box for wireless terminal test is provided to simply perform various tests with high reliability even in a non-contact (wireless) connection state with an antenna of a wireless terminal. The shield box includes a metallic box having an internal wireless terminal receiving space therein, and a probe antenna which is provided in the metallic box, and located right above or right below an antenna part of a wireless terminal received in the metallic box to receive a signal from a wireless terminal antenna in a non-contact manner. The metallic box is provided therein with an electronic wave absorber. The probe antenna is a patch antenna. The metallic box includes two parts of upper and lower cases including metallic materials, respectively, such that the metallic box is openable. The upper and lower cases are hinged with each other on rear surfaces thereof.

11 Claims, 6 Drawing Sheets

(56) References Cited

U.S. PATENT DOCUMENTS

| | | | | |
|---|---|---|---|---|
| 7,592,959 B1* | 9/2009 | Bynum | H01Q 1/52 | |
| | | | 343/703 | |
| 7,671,803 B2* | 3/2010 | Neill | H01Q 1/38 | |
| | | | 343/700 MS | |
| 8,203,850 B2* | 6/2012 | Bouza, II | H04K 3/28 | |
| | | | 361/730 | |
| 8,208,273 B1* | 6/2012 | Alcala | H05K 9/0069 | |
| | | | 361/817 | |
| 8,412,123 B2* | 4/2013 | Foster | H04K 3/415 | |
| | | | 455/134 | |
| 8,618,426 B2* | 12/2013 | Malone | H05K 9/0045 | |
| | | | 174/382 | |
| 9,002,288 B1* | 4/2015 | Reible | A47B 81/06 | |
| | | | 174/377 | |
| 9,485,038 B2* | 11/2016 | Olgaard | H04B 17/15 | |
| 9,521,704 B2* | 12/2016 | Reiffenrath | G01R 29/105 | |
| 9,774,406 B2* | 9/2017 | Huynh | H04B 17/29 | |
| 9,774,409 B1* | 9/2017 | Lee | H04B 17/30 | |
| 2004/0257097 A1* | 12/2004 | Beaucag | G01R 31/2808 | |
| | | | 324/754.15 | |
| 2005/0077353 A1* | 4/2005 | Oishi | G06K 7/0008 | |
| | | | 235/385 | |
| 2005/0156794 A1* | 7/2005 | Theobold | H01Q 1/007 | |
| | | | 343/702 | |
| 2007/0125972 A1* | 6/2007 | Chang | H05K 9/0069 | |
| | | | 250/515.1 | |
| 2007/0126620 A1* | 6/2007 | Channabasappa | H01Q 1/521 | |
| | | | 342/1 | |
| 2011/0069819 A1* | 3/2011 | Urban | A61B 6/547 | |
| | | | 378/197 | |
| 2012/0055824 A1* | 3/2012 | Nash | H05K 9/0045 | |
| | | | 206/320 | |
| 2013/0257468 A1* | 10/2013 | Mlinarsky | G01R 1/18 | |
| | | | 324/750.27 | |
| 2014/0141726 A1* | 5/2014 | Schlub | G01R 29/0857 | |
| | | | 455/67.12 | |
| 2015/0311591 A1* | 10/2015 | Golombek | H01Q 1/48 | |
| | | | 343/848 | |
| 2016/0192213 A1* | 6/2016 | Diperna | H04B 17/11 | |
| | | | 455/425 | |

FOREIGN PATENT DOCUMENTS

| | | |
|---|---|---|
| KR | 10-2012-0096927 A | 8/2012 |
| KR | 10-1442557 B1 | 9/2014 |

* cited by examiner

SHIELD BOX FOR WIRELESS TERMINAL TEST

BACKGROUND OF THE INVENTION

1. Field of the Invention

The present invention relates to a shield box for wireless terminal test, and more particularly to a shield box for wireless terminal test, capable of simply performing various tests with high reliability even in a non-contact (wireless) connection state with an antenna of a wireless terminal.

2. Description of the Related Art

A wireless terminal, which serves as one component of a mobile communication system, directly becomes a device under test (DUT), or serves as one component of a test system when the mobile communication system is tested. When the wireless terminal is used for test, the test system is generally connected with the wireless terminal through a radio frequency (RF) port provide in the terminal.

FIG. 1 is a rear view schematically showing a smart phone, which is a representative device of the wireless terminal, after a rear plane cover is removed from the smart phone. As shown in FIG. 1, a rear surface 12 having no rear surface cover of a typical smart phone 18 is provided at the center thereof with a battery 18 which is detachably provided at the center. The battery 18 is provided at upper and lower portions thereof with at least one of antennas 14a and 14b, for example, multiple input and multiple output (MIMO) antennas (in the case of a long-term evolution (LTE)), and test radio frequency (RF) ports 16a and 16b connected with the antennas 14a and 14b in a wired scheme, respectively. Various camera modules are provided above the battery 18. In this case, the various camera modules are shown. In addition, the smart phone 10 may include a WCDMA antenna (not shown) and a wired RF port for the WCDMA antenna.

FIG. 2 is a block diagram showing the physical structure of wireless terminal test system employing the wireless terminal shown in FIG. 1. As shown in FIG. 2, according to the related art, the wireless terminal test system mainly may include a shield box 20 to receive the wireless terminal 10, an internal RF cable 30 to connect the wireless terminal 10 with the shield box 20, and a test device 50 connected with the shield box 20 through an external RF cable 40.

In the above configuration, the shield box 20 includes a rectangular metallic case 22 having an openable structure so that the wireless terminal 10 may be received therein. The shield box 20 secures a receiving space 26 in a sufficient volume to receive all of a smart phone, a smart pad, and the like. When the wireless terminal 10, such as a smart phone, is received in the shield box 20 through the above structure, electronic waves radiated from the antennas 14a and 14b are reflected so that the characteristics of the antennas 14a and 14b may be varied or a standing wave may be generated depending on the receiving positions of the wireless terminal 10. In order to prevent the variation in the characteristics and the generation of the standing wave, an electronic wave absorber 24 is attached to an inner surface of the metallic case 22 to absorb an electronic wave radiated from the wireless terminal 10.

As shown in FIG. 2, reference number 28 denotes an RF connector for box attachment, which is formed through the metallic case 22. Internal and external RF cables 30 and 40 include coaxial cables and RF connectors connected with opposite ends of the coaxial cables. One of the RF connectors of the internal RF cable 30 is connected with the RF port 16a or 16b of the wireless terminal 20, and the other RF connector of the internal RF cable 30 is connected with an inner port of the RF connector 298 for the box attachment.

As described above, according to the related art, the wireless terminal test system can perform test with high accuracy and consistency while a complicated preparation process is required since the antenna of the wireless terminal and the test device are connected with each other in a wired manner through the wired RF ports. In other words, the rear plane cover of the wireless terminal has to be open, and the wireless terminal and the connector for the box attachment have to be exactly connected with each other through the RF cable, which requires a cumbersome and cautious procedure.

In addition, recently, some smartphones that have been released recently do not offer wired ports. In order to test the smartphones, a plastic case of the rear plane of the smartphone is manually bored and an RF cable is connected with the plastic case in a soldering manner. In addition, although LO LTE terminals having two MIMO antennas require an environment that multi-path fading is present for insulation between two antennas, a line of sight environment is formed in the shield box, so that the reliability of the test result cannot be ensured.

As cited references, there are Korean Unexamined Patent Publication No. 10-2012-0096927 entitled "Antenna System Providing High Isolation Between Antennas On Electronics Device" (Patent document 1) and Korean Patent Registration No. 10-1442557 entitled "System For Testing Sensitivity Of Wireless Smartdevice In Reconfigurable Reverberation Chamber" (Patent document 2).

SUMMARY OF THE INVENTION

Accordingly, the present invention has been made keeping in mind the above problems occurring in the related art, and an object of the present invention is to provide a shield box for wireless terminal test, capable of easily and simply performing various tests with high reliability even in a non-contact (wireless) connection state with an antenna of a wireless terminal.

To accomplish the object, according to one aspect of the present invention, there is provided a shield box for wireless terminal test. The shield box includes a metallic box having an internal wireless terminal receiving space therein, and a probe antenna which is provided in the metallic box, and located right above or right below an antenna part of a wireless terminal received in the metallic box to receive a signal from a wireless terminal antenna in a non-contact manner.

In the configuration, the metallic box is provided therein with an electronic wave absorber.

The probe antenna is a patch antenna.

The metallic box includes two parts of upper and lower cases including metallic materials, respectively, such that the metallic box is openable.

The upper and lower cases are hinged with each other on rear surfaces thereof.

First electronic wave absorbers are attached to inner surfaces of the upper and lower cases to prevent an electronic wave radiated from the wireless terminal antenna from being reflected in the shield box.

The probe antenna is placed at a location in the upper case corresponding to the antenna part of the wireless terminal when the upper case and the lower case are closed in a state that the wireless terminal is received with a rear surface facing upward and the probe antenna attached to a second electronic wave absorber is opposite to the wireless terminal antenna. When at least two probe antennas are provided, the shield box further includes a third electronic wave absorber filled in an entire space between at least two probe antennas. In this case, the first to third electronic wave absorbers represent relation of the third electronic wave absorber≥the first electronic wave absorber≥the second electronic wave absorber in electronic wave absorption performance. In this case, the lower case is formed on a lateral side or a rear surface thereof with a radio frequency connector connected with a test device, and the radio frequency connector is connected with the probe antenna in a wired manner through a radio frequency cable.

In addition, the probe antenna is placed at a location in the lower case corresponding to the antenna part of the wireless terminal when the upper case and the lower case are closed in a state that the wireless terminal is received with the rear surface facing downward and the probe antenna attached to the second electronic wave absorber is opposite to the wireless terminal antenna. When at least two probe antennas are provided, and the shield box further includes a third electronic wave absorber filled in an entire space between at least two probe antennas. In this case, the first to third electronic wave absorbers represent relation of the third electronic wave absorber≥the first electronic wave absorber≥the second electronic wave absorber in electronic wave absorption performance. In this case, the lower case is formed on a lateral side or a rear surface thereof with a radio frequency connector connected with a test device, and the radio frequency connector is connected with the probe antenna in a wired manner through a radio frequency cable.

As described above, according to the shield box for wireless terminal test, since the wireless terminal is not connected with the RF connector of the shield box in a wired manner, the rear panel cover may not be removed from the wireless terminal, which can remarkably simplifies a preparation work for test, and can test the wireless terminal having no wired RF port.

Further, since the line of sight environment is not provided in the shield box, the reliability of the test result can be ensured when the wireless terminal employing at least two MIMO antennas is tested.

DETAILED DESCRIPTION OF THE INVENTION

Hereinafter, a shield box for wireless terminal test according to an exemplary embodiment of the present invention will be described in detail with reference to accompanying drawings.

Figure 1:
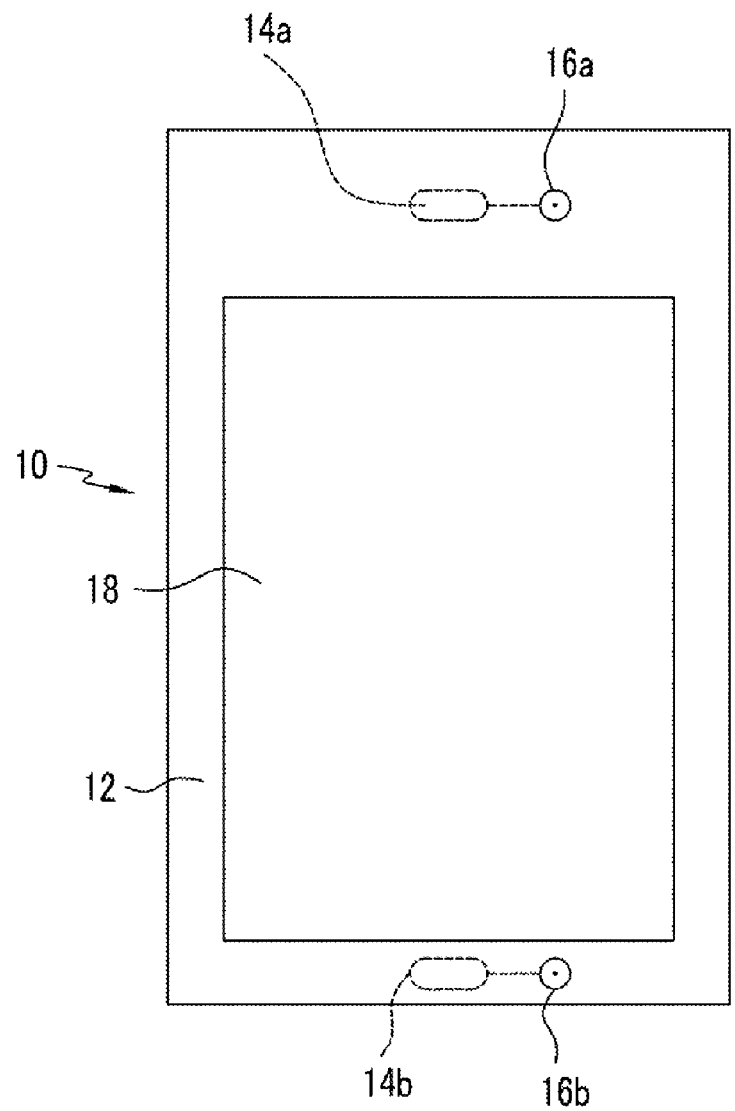
FIG. 1 is a rear view schematically showing a smartphone, which is a representative device of a wireless terminal, after a rear plane cover is removed from the smartphone.
Figure 2:
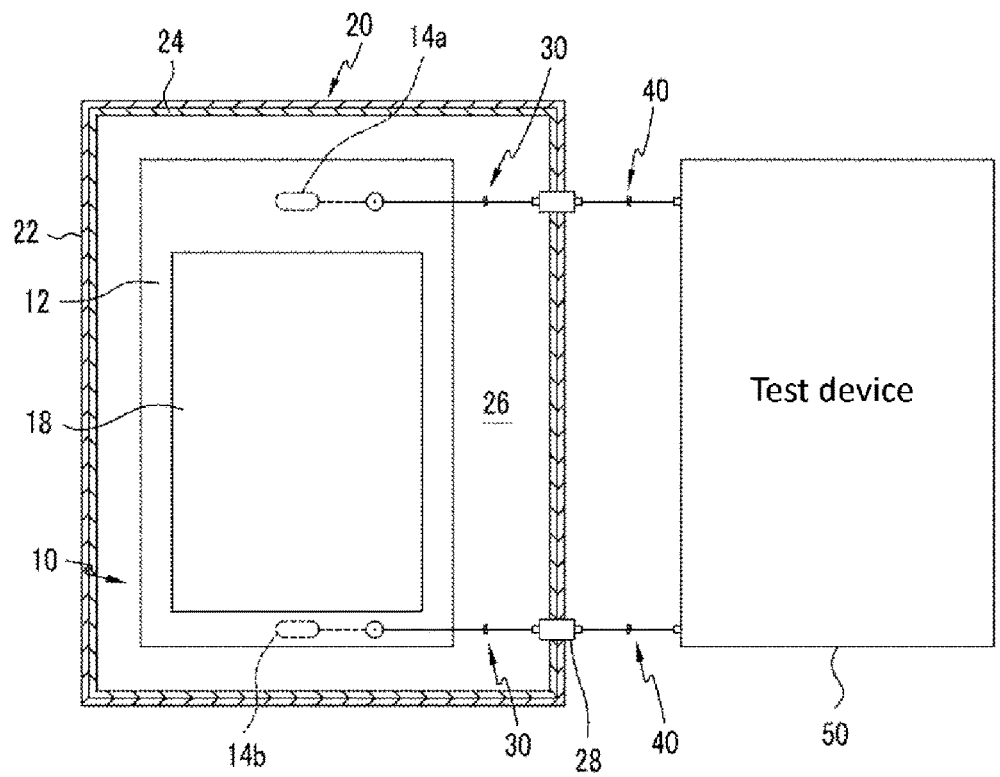
FIG. 2 is a block diagram showing the physical structure of wireless terminal test system employing the wireless terminal shown in FIG. 1.
Figure 3:
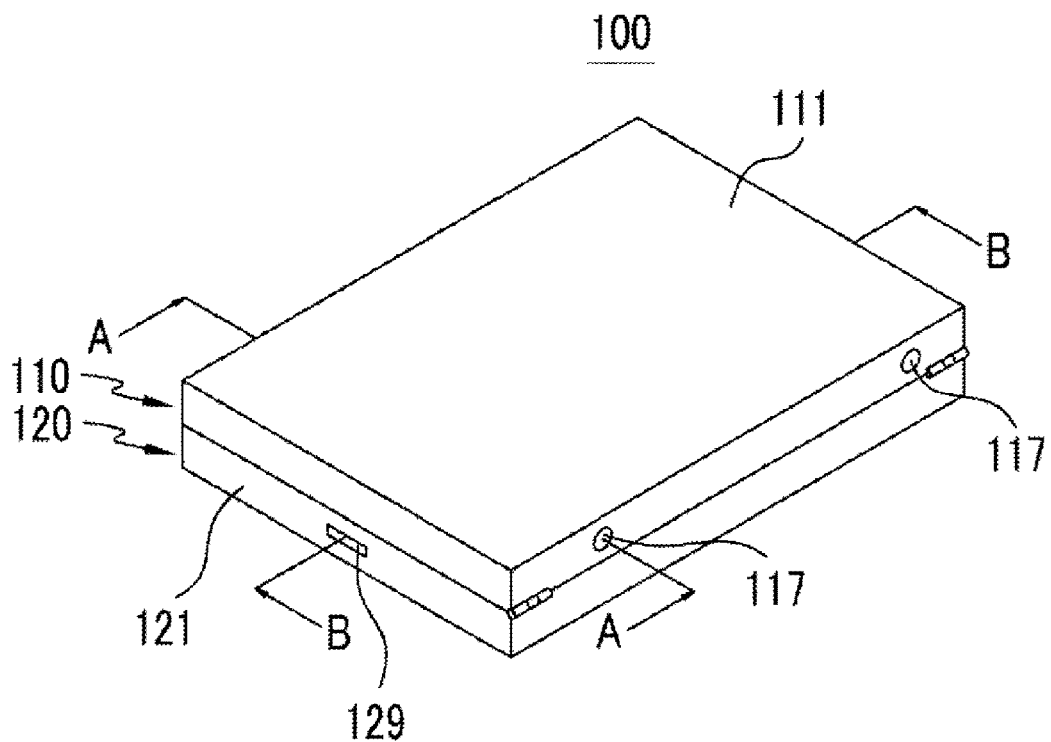
FIG. 3 is a perspective view showing a closed state of a shield box for wireless terminal test according to the present invention.
Figure 4:
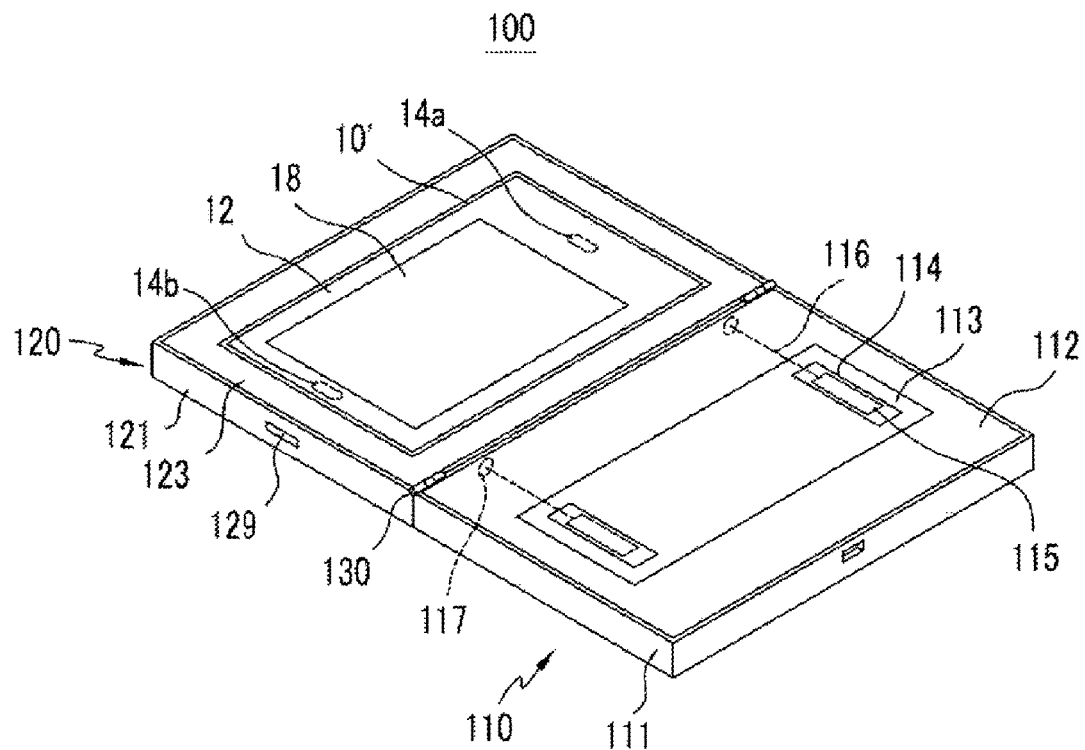
FIG. 4 is a perspective view showing an open state of the shield box for the wireless terminal test shown in 3.
Figure 5:
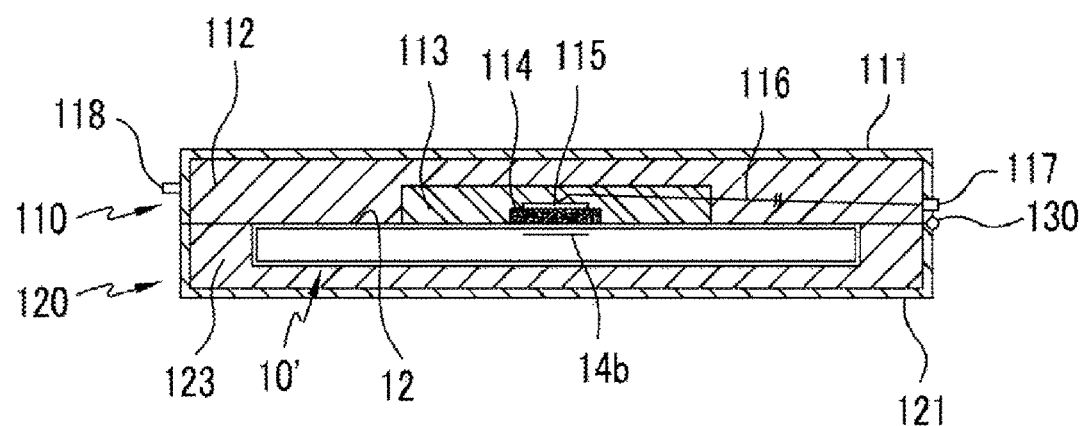
FIG. 5 is a sectional view taken along line A-A of FIG. 3.
Figure 6:
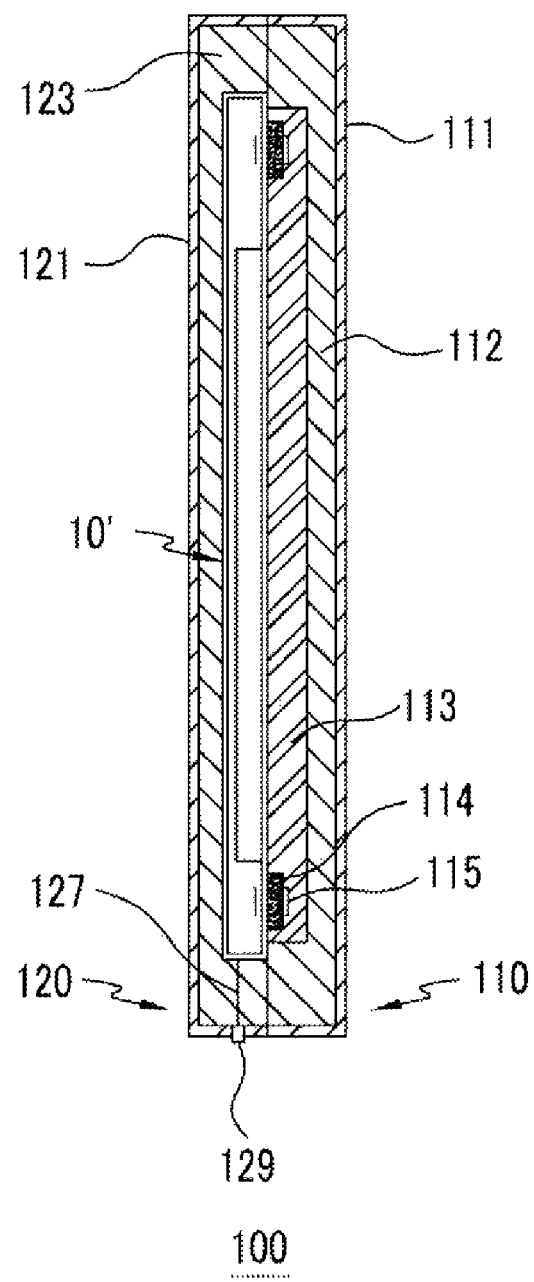
FIG. 6 is a sectional view taken along line B-B of FIG. 3.

FIG. 3 is a perspective view showing a closed state of a shield box for wireless terminal test according to the present invention. FIG. 4 is a perspective view showing an open state of the shield box for the wireless terminal test shown in 3. FIG. 5 is a sectional view taken along line A-A of FIG. 3. FIG. 6 is a sectional view taken along line B-B of FIG. 3.

As shown in FIGS. 3 to 6, a shield box 100 for wireless terminal test according to the present invention may include a box having a large internal space for receiving a wireless terminal, for example, a rectangular box, and probe antennas 115 installed corresponding to parts for antennas 14a and 14b of the wireless terminal 10', for example, located right above or right under the antennas 14a and 14b to receive signals from the terminal antennas 14a and 14b in a non-contact (wireless) manner.

In the above configuration, the probe antenna 115 may be realized with a patch antenna (micro-strip antenna) including a metallic pattern on a micro-strip substrate.

Next, preferably, the rectangular box includes two upper and lower parts and to be open. In this case, upper and lower boxes 110 and 120 include upper and lower cases 111 and 121 formed of metallic materials, which may suppress external electronic waves, and hinged with each other on rear surfaces thereof. Meanwhile, electronic wave absorbers (first electronic wave absorbers) 112 and 123 are attached to inner surfaces of the upper and lower cases 111 and 121 so that various characteristics are not distorted by electronic waves radiated from the terminal antennas 14a and 14b and reflected by the terminal antennas 14a and 14b similarly to a conventional shield box.

In this case, the receiving space defined by the internal space of the lower case 121 and the first electronic wave absorber 123 is substantially equal to the wireless terminal 10' to be tested in size. For example, preferably, each of the front, rear, left, and right sides of the receiving space is spaced apart from each side of the wireless terminal 10' by 5 m or less, so that the line of sight environment is not provided.

Meanwhile, the probe antennas 115 are located in the upper case 111 corresponding to the terminal antennas 14a and 14b when the box is closed. When the terminal antennas 14a and 14b opposite to the probe antennas 115 with a free space interposed therebetween, the radiation characteristics of the terminal antennas 14a and 14b may be changed by the probe antennas 115. For example, as the signals, which are radiated from the terminal antennas 14a and 14b, are reflected by the probe antennas 115 and re-incident on the terminal antennas 14a and 14b, the radiation characteristics may be changed. In order to prevent the change of the radiation characteristics, the probe antennas 115 are attached to matching electronic wave absorbers 114 (second electronic wave absorbers) 114. In other words, the probe antennas 115 are provided therein with the second electronic wave absorbers 114 while facing the terminal antennas 14a and 14b. The resulting signal attenuation may be sufficiently compensated through an amplifying process thereafter.

Preferably, the second electronic wave absorbers 14 are slightly larger than the probe antennas 115 or the terminal antennas 14a and 24b in size. Therefore, according to the present embodiment, when at least two terminal antennas 14a and 14b are provided in the wireless terminal 10', for example, at least two multiple input and multiple output (MIMO) antennas are provided, a free space may be formed between two second electronic wave absorbers 114. This space acts as a line of sight environment for the two probe antennas 115, which results in the breakdown of the insulation between the two MIMO antennas. In order to prevent the breakdown of the insulation, an electronic wave absorber (third radio wave absorbing material) 113 may be further provided to fill the space between the two probe antennas 115.

In addition, although all of the first to third electronic wave absorbers 112, 114, and 113 may be form of the same material, a material having a superior electronic wave absorbing property is more expensive. Therefore, the first to third electronic wave absorbers 112, 114, and 113 may be formed of mutually different materials or at least one of the first to third electronic wave absorbers 112, 114, and 113 may be formed of a different material when considering a cost aspect. When the first to third electronic wave absorbers 112, 114 and 113 are formed of mutually different materials, the first to third electronic wave absorbers 112, 114 and 113 preferably represent the relation of the third electronic wave absorber 113≥the first electronic wave absorber 112≥the second electronic wave absorber 114 in terms of the electronic wave absorption performance.

In FIG. 4, reference 117 denotes an RF connector formed at a location to minimize the path loss of the probe antenna 115, for example, formed through the exposure through a rear surface of the upper case 111 of the shield box to connect the shield box 100 with the test device through an RF cable. The RF connector 117 is connected to the probe antenna 115 through the RF cable 116, for example, a coaxial cable. If two or more RF cables 116 are present, that is, two or more probe antennas (or RF connectors) 115 are present, it is preferable to use RF cables 116 having equal lengths so that path loss is uniform. In FIG. 5, reference numeral 118 denotes a handle formed in the upper case 111 for facilitating opening and closing of the upper case 111. Reference numeral 129 denotes a USB port provided at a proper position of the shield box, for example, the lateral side of the lower case 121. The USB port 129 has a cable 127 and a USB connector (not shown) linked with the cable 127 to be connected with a USB terminal of the wireless terminal 10'.

Figure 7:
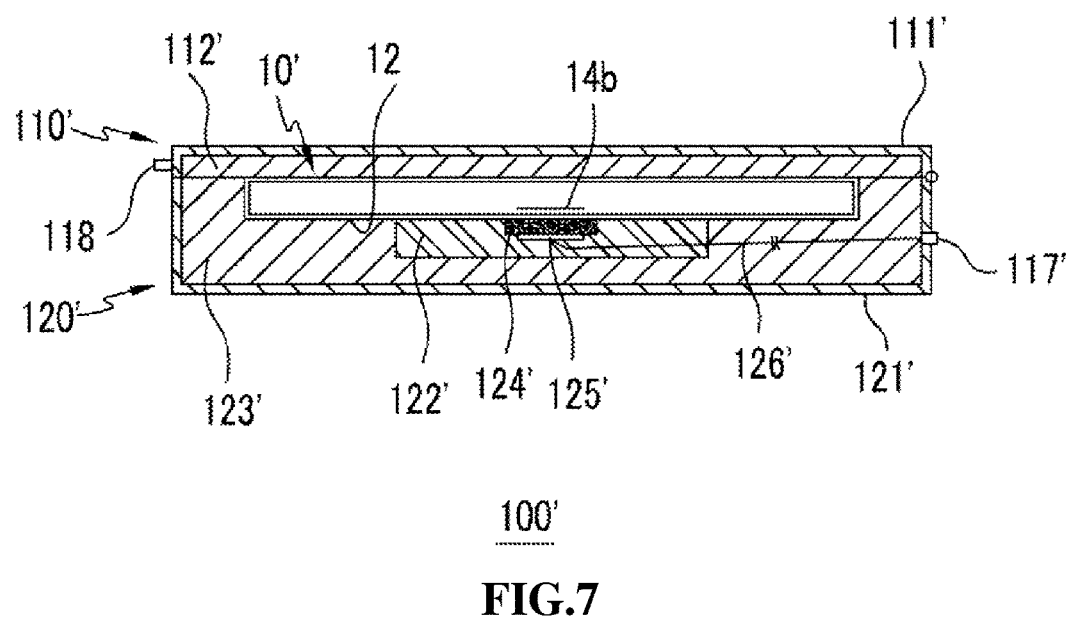
FIG. 7 is a sectional view showing according to another embodiment in relation to FIG. 5.
Figure 8:
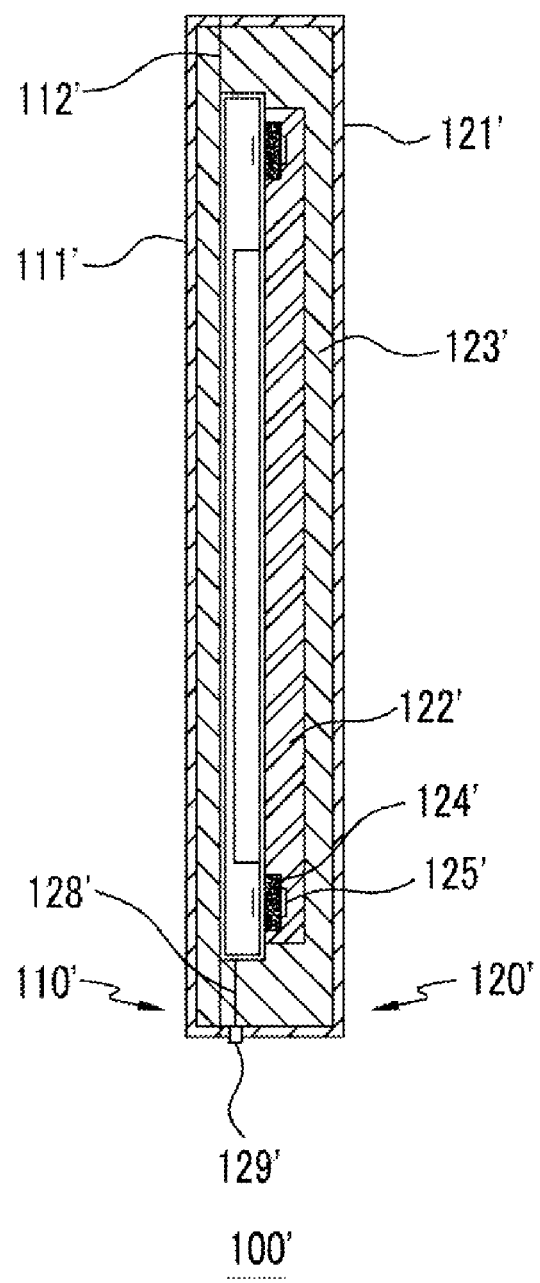
FIG. 8 is a sectional view showing according to another embodiment in relation to FIG. 6.

FIG. 7 is a sectional view according to another embodiment in relation to FIG. 5. FIG. 8 is a sectional view according to another embodiment in relation to FIG. 6. As shown in FIGS. 7 and 8, according to another embodiment of the present invention, a shield box 100' for wireless terminal test receives a wireless terminal 10' such that the rear surface of the wireless terminal 10' is located at a lower portion of the shield box 100'. Accordingly, all of a probe antenna 125', and first to third electronic wave absorbers 123', 124', and 122' are housed in the lower case 121', and only the first electronic wave absorber 112' is provided an entire portion of in the case 111'. Through the above structure, the volume of the lower case 121' may be larger than that of the upper case 111', and an RF connector 127' may be formed at a proper location of the lower case 121', for example, on a rear surface of the lower case 121'. The probe antenna 125' and the first to third electronic wave absorbers 123', 124', and 122' are arranged symmetrically to those of the embodiments shown in FIGS. 5 and 6 about a horizontal line. In other words, the second electronic wave absorber 124' is in contact with the terminal antenna while facing the terminal antenna and the probe antenna 125' is provided below the second electronic wave absorber 124'. The third electronic wave absorber 122' is provided to cover the entire portion of the second electronic wave absorber 124' and the probe antenna 125'. The first electronic wave absorber 123' is provided in the form of surrounding the third electronic wave absorber 122'.

According to the embodiment shown in FIGS. 7 and 8, since the front surface of the wireless terminal 10' faces upward, the wireless terminal, that is, the touch screen may be operated in the state the upper case 111' of the shield box 100' is open.

As described above, although a shield box for wireless terminal test according to an exemplary embodiment of the present invention will be described in detail for the illustrative purpose, various modifications are possible within the scope of the inventive concept. For example, although two terminal antennas have been described according to the above-described embodiments, one or three antennas may be employed. In this case, probe antennas are increased in one-to-one correspondence to the terminal antennas in number.

What is claimed is:

1. A shield box for wireless terminal test, the shield box comprising:
    a metallic box having an upper case and a lower case connected to the upper case, the upper case and lower case being configured to be folded with each other to close the metallic box and to be un-folded to open the metallic box;
    a first upper electronic wave absorber disposed inside the upper case;
    a first lower electronic wave absorber disposed inside the lower case and having a recess configured to receive a wireless terminal having an antenna part;
    at least one second wave absorber disposed in the upper case or in the lower case; and
    at least one probe antenna located on an upper surface of the at least one second wave absorber disposed in the upper case or located on a lower surface of the at least one second wave absorber disposed in the lower case,
    wherein the at least one second wave absorber is located between the antenna part of the wireless terminal and the at least one probe antenna when the metallic box is closed to receive a signal from the wireless terminal antenna in a non-contact manner.

2. The shield box of claim 1, wherein the at least one probe antenna is a patch antenna.

3. The shield box of claim 1, wherein the upper and lower cases are hinged with each other on rear surfaces thereof.

4. The shield box of claim 1, wherein the at least one probe antenna is placed at a location in the upper case corresponding to the antenna part of the wireless terminal when the upper case and the lower case are closed in a state that the wireless terminal is received in the lower case with a rear surface facing upward, and
    the probe antenna attached to the at least one second electronic wave absorber is opposite to the wireless terminal antenna when the metallic box is closed.

5. The shield box of claim 4, wherein the at least one probe antenna comprises at least two probe antennas, and the shield box further comprises a third electronic wave absorber filled in an entire space between the at least two probe antennas.

6. The shield box of claim 5, wherein the first upper and lower to third electronic wave absorbers represent a relation that the third electronic wave absorber is greater than or equal to the first upper and lower electronic wave absorbers which are greater than or equal to the at least one second electronic wave absorber in electronic wave absorption performance.

7. The shield box of claim 4, wherein the lower case is formed on a lateral side or a rear surface thereof with a radio frequency connector connected with a test device, and the radio frequency connector is connected with the at least one probe antenna in a wired manner through a radio frequency cable.

8. The shield box of claim 1, wherein the at least one probe antenna is placed at a location in the lower case corresponding to the antenna part of the wireless terminal when the upper case and the lower case are closed in a state that the wireless terminal is received in the lower case with a rear surface facing downward, and the at least one probe antenna attached to the at least one second electronic wave absorber is opposite to the wireless terminal antenna.

9. The shield box of claim 8, wherein the at least one probe antenna comprises at least two probe antennas, and the shield box further comprises a third electronic wave absorber filled in an entire space between the at least two probe antennas.

10. The shield box of claim 9, wherein the first upper and lower to third electronic wave absorbers represent a relation that the third electronic wave absorber is greater than or equal to the first upper and lower electronic wave absorbers which are greater than or equal to the at least one second electronic wave absorber in electronic wave absorption performance.

11. The shield box of claim 8, wherein the lower case is formed on a lateral side or a rear surface thereof with a radio frequency connector connected with a test device, and the radio frequency connector is connected with the at least one probe antenna in a wired manner through a radio frequency cable.

* * * * *